United States Patent
Wang et al.

(10) Patent No.: US 9,367,099 B2
(45) Date of Patent: Jun. 14, 2016

(54) ELECTRONIC DEVICE ENCLOSURE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Liang-Chin Wang, New Taipei (TW); Yu-Ming Xiao, Wuhan (CN); Cong Tang, Wuhan (CN); Yun Chen, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/552,797

(22) Filed: Nov. 25, 2014

(65) Prior Publication Data
US 2016/0116949 A1    Apr. 28, 2016

(30) Foreign Application Priority Data

Oct. 24, 2014  (CN) .......................... 2014 1 0573808

(51) Int. Cl.
| | |
|---|---|
| *H05K 5/02* | (2006.01) |
| *G06F 1/18* | (2006.01) |
| *H05K 5/00* | (2006.01) |
| *H05K 5/03* | (2006.01) |

(52) U.S. Cl.
CPC .............. *G06F 1/181* (2013.01); *H05K 5/0004* (2013.01); *H05K 5/0217* (2013.01); *H05K 5/03* (2013.01)

(58) Field of Classification Search
CPC ........ G06F 1/181; H05K 5/03; H05K 5/0004; H05K 5/0217
USPC ............ 312/223.1, 223.2, 257.1; 361/679.02, 361/679.6, 724; 220/4.02
See application file for complete search history.

(56) References Cited

U.S. PATENT DOCUMENTS

| | | | | |
|---|---|---|---|---|
| 4,645,275 A | * | 2/1987 | Pucci ....................... | B41J 29/13 312/223.2 |
| 6,373,692 B1 | * | 4/2002 | Cheng ..................... | G06F 1/181 220/4.02 |
| 2002/0195910 A1 | * | 12/2002 | Hus ........................ | G06F 1/1626 312/223.2 |

* cited by examiner

*Primary Examiner* — James O Hansen
(74) *Attorney, Agent, or Firm* — ScienBiziP, P.C.

(57) ABSTRACT

Electronic device enclosure includes a base, a cover, and a top frame. The base comprises a bottom plate, a rear plate with a first edge coupled to an edge of the bottom plate, and two opposing side plates with a first edge of each side plate coupled to an edge of the bottom plate and a second edge of each side plate coupled to the rear plate. The top frame is positioned along a second edge of the rear plate and each side plate, the second rear plate edge being opposite the first rear plate edge, and each second side plate edge being opposite the first edge of the side plate. The base and the cover plate cooperate to form a receiving space for enclosing a plurality of electronic components, and the bottom plate, the rear plate and each side plate are each primarily composed of non-metallic material.

18 Claims, 10 Drawing Sheets

ELECTRONIC DEVICE ENCLOSURE

FIELD

The subject matter herein generally relates to an electronic device enclosure. The electronic device enclosure can include space to receive various components, for example components for a personal computer.

BACKGROUND

An electronic device enclosure such as a personal computer chassis often includes a main body and a cover attached to the main body. The main body includes a bottom plate, two side plates, and a top plate cooperatively defining a receiving area for receiving electronic components. The electronic components can include a motherboard, hard disks, a plurality of expansion cards, and a power supply. The computer chassis can be metal.

BRIEF DESCRIPTION OF THE DRAWINGS

Implementations of the present technology will now be described, by way of example only, with reference to the attached figures.

DETAILED DESCRIPTION

Figure 1:
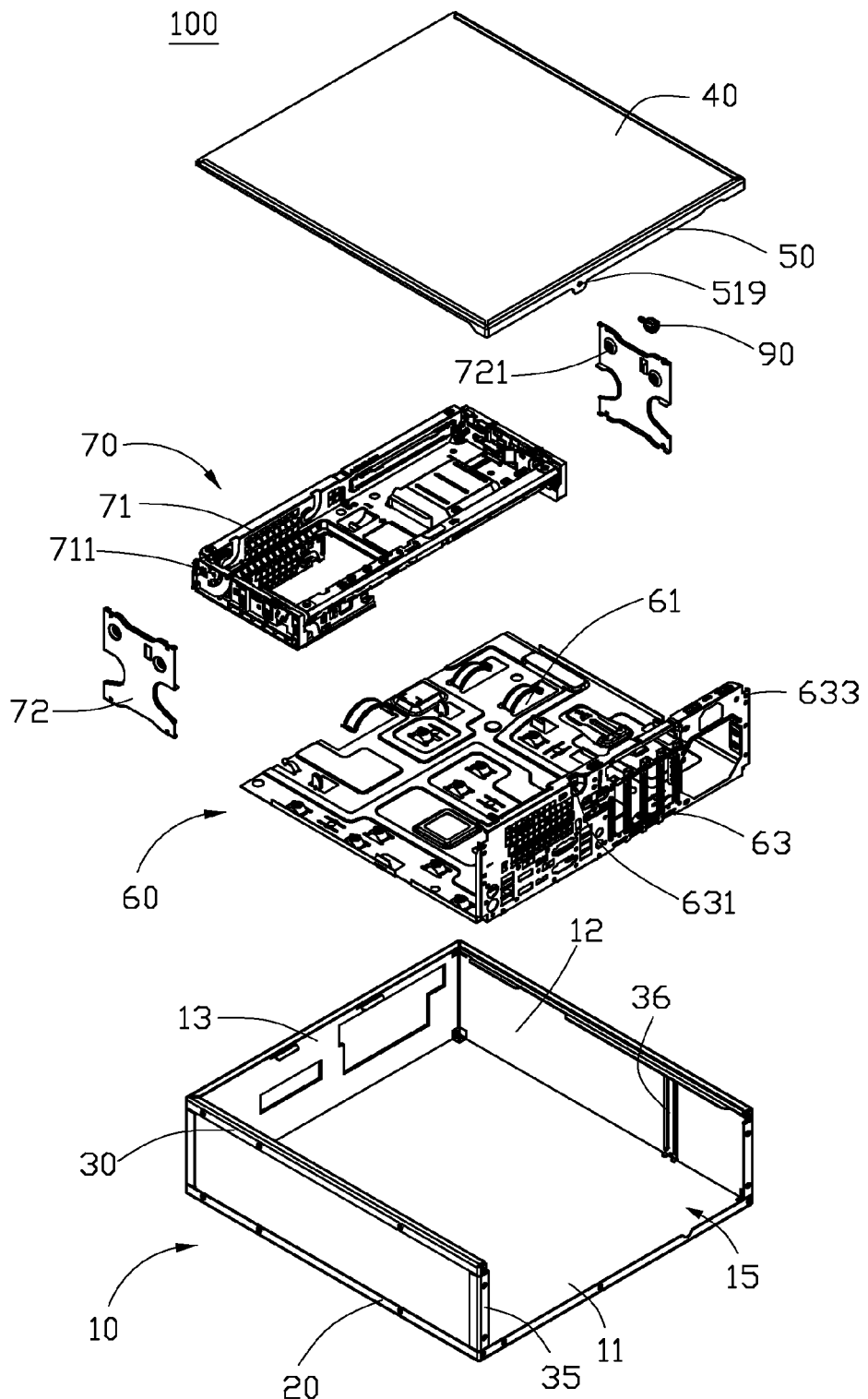
FIG. 1 is an exploded, isometric view of an embodiment of an electronic device enclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to an electronic device enclosure comprising a base, a cover, and a top frame. The base comprises a bottom plate, a rear plate with a first edge coupled to an edge of the bottom plate and positioned substantially perpendicular to the bottom plate, and two opposing side plates with a first edge of each side plate coupled to an edge of the bottom plate and positioned substantially perpendicular to the bottom plate and a second edge of each side plate coupled to the rear plate and positioned substantially perpendicular to the rear plate. The top frame is positioned along a second edge of the rear plate and each side plate, the second rear plate edge being substantially parallel to and opposite the first rear plate edge, and each second side plate edge being substantially parallel to and opposite the first edge of the side plate. The base and the cover plate cooperate to form a receiving space for substantially enclosing a plurality of electronic components positioned within the receiving space; and the bottom plate, the rear plate and each side plate are each primarily composed of non-metallic material.

Figure 2:
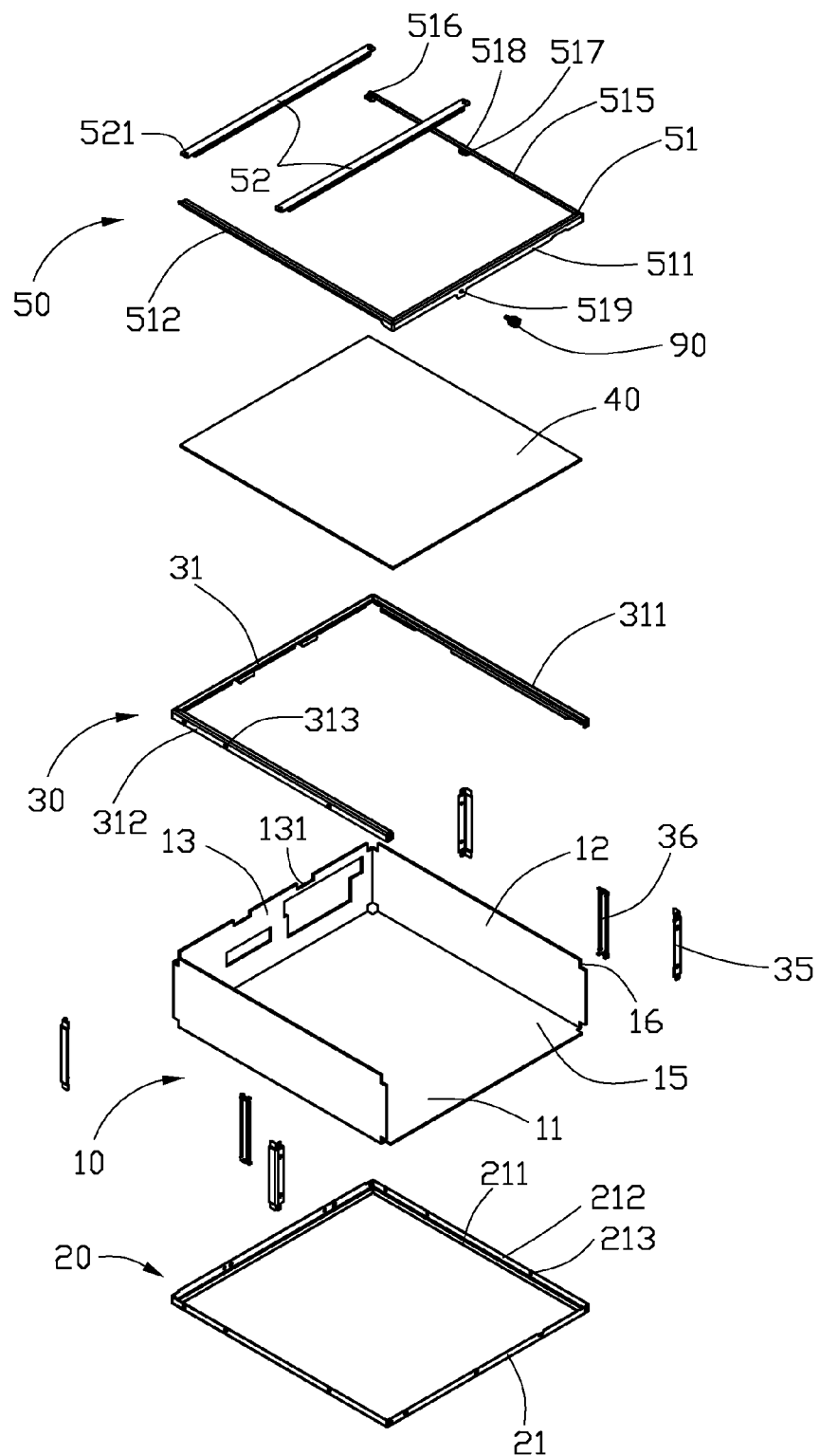
FIG. 2 is similar to FIG. 1, but a bracket and a mounting panel are not shown.

FIGS. 1-2 illustrate an embodiment of an electronic device enclosure 100. The electronic device enclosure 100 comprises a base 10, a bottom frame 20, a top frame 30, a cover 40, a cover frame 50, a mounting panel 60 and a bracket 70. The base 10 and the cover 40 are made of non-metallic material, such as paper, wood, bamboo, plastic, etc. The non-metallic material can be lighter than metal.

The base 10 can comprise a bottom plate 11, two side plates 12 and a rear plate 13. The two side plates 12 are substantially perpendicular to couple with opposite edges of the bottom plate 11, and the rear plate 13 is substantially coupled with a rear edge of the bottom plate 11. The rear plate 13 is located between the two side plates 12, and the rear plate 13 is coupled to a top edge of each side plate. Two cutouts 131 are defined in the rear plate 13, and a plurality of receiving slots 16 is defined on each corner of the base 10, such as, a receiving slot 16 is defined a jointing portion which is coupled a side plate 12, a rear plate 13 and the bottom plate 11. An opening 15 is defined in the base 10 opposite to the rear plate 13.

Figure 3:
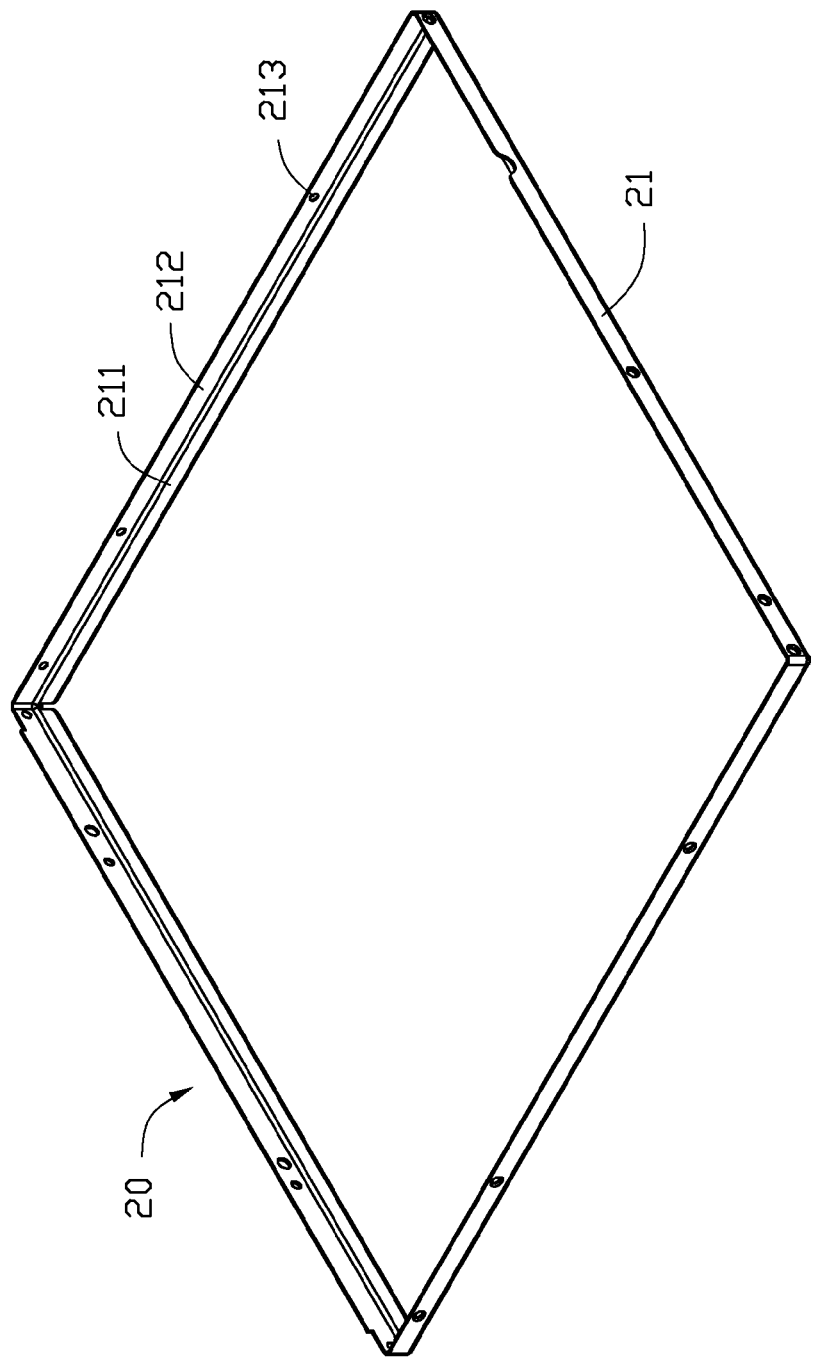
FIG. 3 is an isometric view of a bottom frame of the electronic device enclosure of FIG. 2.

FIG. 3 illustrates an embodiment of the bottom frame 20 of the electronic device enclosure 100. The bottom frame 20 can comprise four bottom poles 21 coupled to each other. Each bottom pole 21 can comprise a horizontal supporting portion 211 and a vertical securing portion 212. A plurality of securing holes 213 is defined in the securing portion 212.

Figure 4:
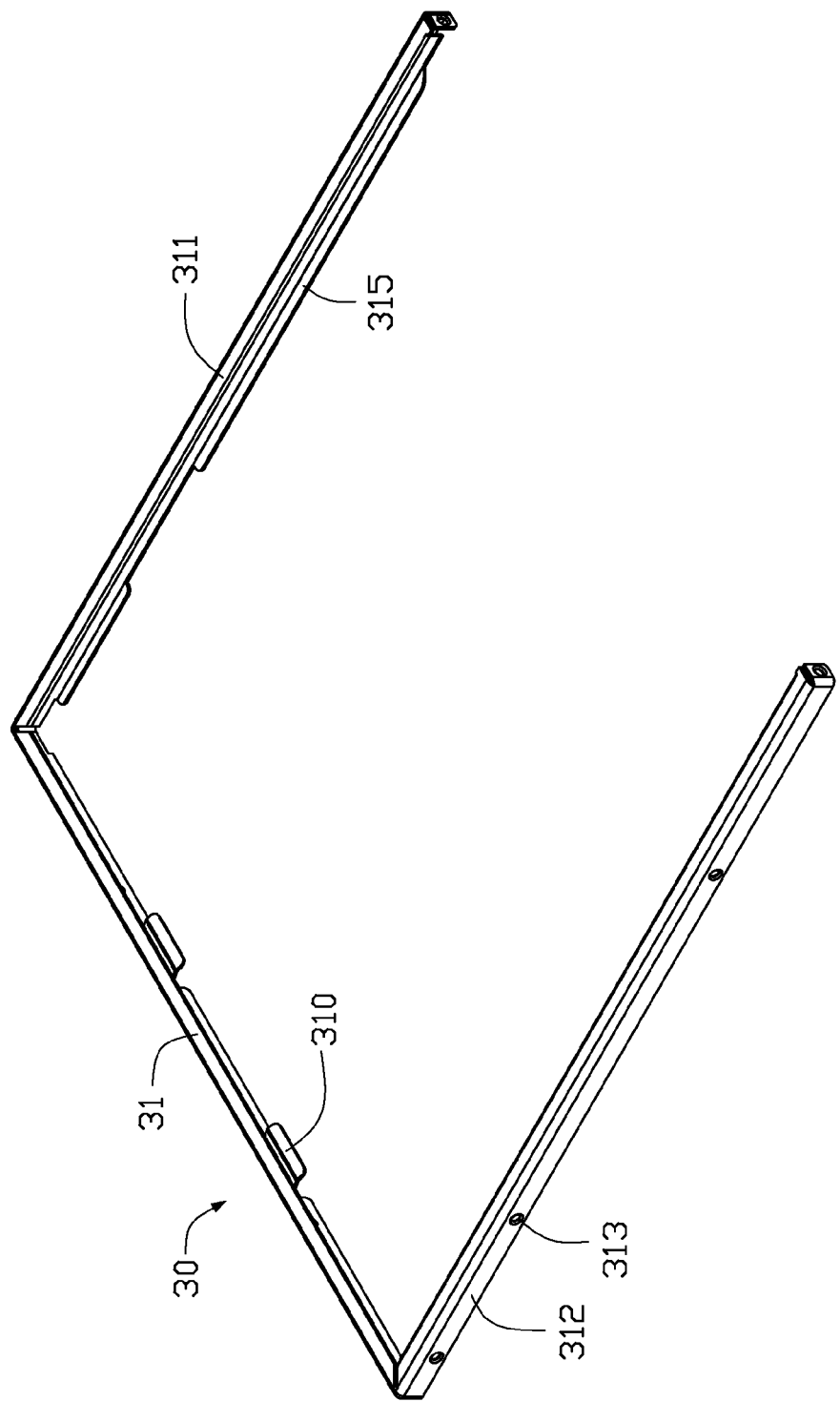
FIG. 4 is an isometric view of a top frame of the electronic device enclosure of FIG. 2.

FIG. 4 illustrates an embodiment of the top frame 30 of the electronic device enclosure 100. The top frame 30 can comprise three top poles 31. Each top pole 31 can comprise a horizontal pressing portion 311 and a vertical mounting portion 312. A plurality of mounting holes 313 is defined in the mounting portion 312. Two extending pieces 310 can extend from one of the three top poles 31 and corresponds to the two cutouts 131. Two limiting pieces 315 can extend from each of another two top poles 131.

Figure 5:
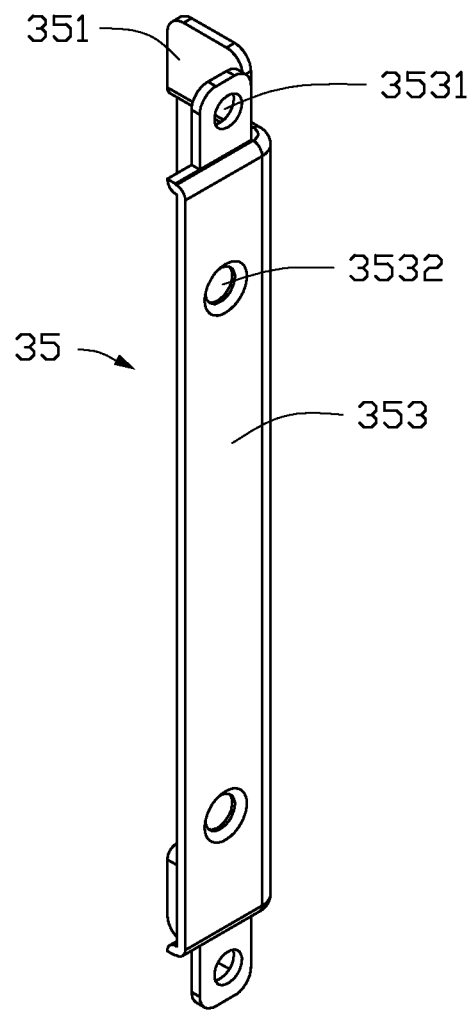
FIG. 5 is an isometric view of a corner bracket of the electronic device enclosure of FIG. 2.

FIG. 5 illustrates an embodiment of a corner bracket 35 of the electronic device enclosure 100. Four corner brackets 35 can be secured to four corners of the base 10. Each corner bracket 35 comprises a first retaining panel 351 and a second retaining panel 353 that is substantially perpendicular to the first retaining panel 351. When the corner bracket 35 is attached to the corner of the base 10, the first retaining panel 351 can be attached to a plate of the base 10, and the second retaining panel 353 can be attached to an adjacent plate of the base 10. Two first retaining holes 3531 and two second retaining holes 3532 are defined in the second retaining panel 353. The two second retaining holes 3532 is located between the two first retaining holes 3531.

Figure 6:
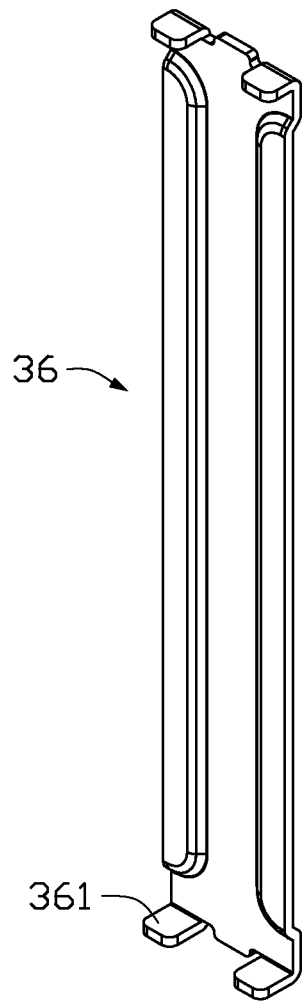
FIG. 6 is an isometric view of a side bracket of the electronic device enclosure of FIG. 2.

FIG. 6 illustrates an embodiment of a side bracket 36 of the electronic device enclosure 100. Two side brackets 36 can be secured to the two side plates 12. Two abutting pieces 361 extend from opposite edges of each side bracket 36 and configured to abut the bottom plate 11 and the limiting pieces 315.

Figure 7:
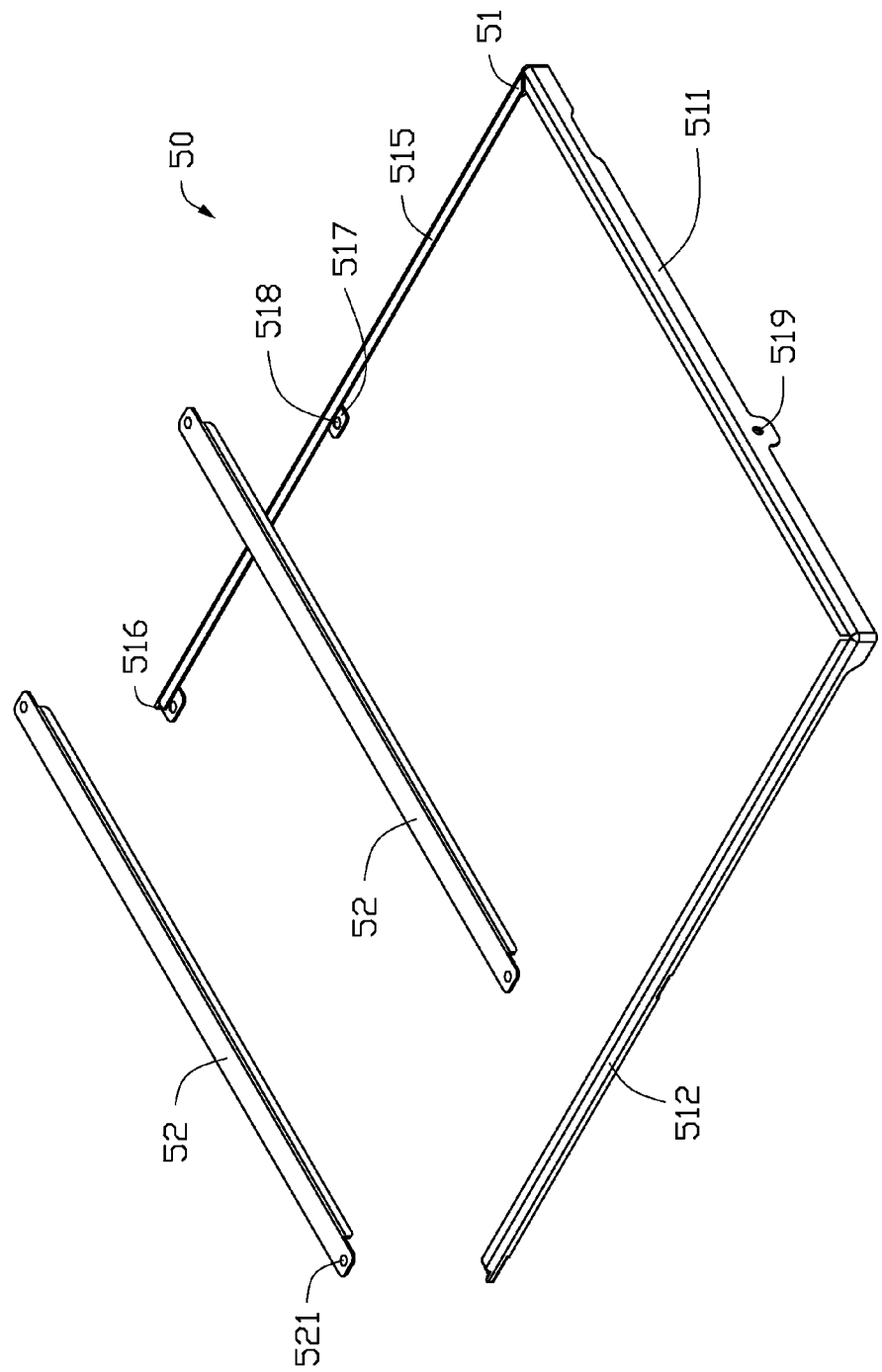
FIG. 7 is an isometric view of a cover frame of the electronic device enclosure of FIG. 2.

FIG. 7 illustrates an embodiment of the cover frame 50 of the electronic device enclosure 100. The cover 40 can be secured to the base 10 covering the base 10. The cover 40 is substantially rectangular. The cover frame 50 can be secured to the cover 40 for strengthening the cover 40. The cover frame 50 comprises a main body 51 and two securing poles 52. The main body 51 comprises a connecting pole 511 and two extending poles 512 extending from opposite ends of the connecting pole 511. A cross-section of each of the connecting poles 511 and the extending poles 512 is substantially L-shaped. Each securing pole 512 comprises a supporting piece 515 and a limiting piece 516. A fixing piece 517 is located on the limiting piece 516, and the fixing piece 517 further defines a fixing hole 518. A fastening hole 519 is defined in the connecting pole 511, and two through holes 521 are defined in opposite ends of each securing pole 52.

The mounting panel 60 can be attached to the base 10 and comprise a bottom portion 61 and a rear portion 63 substantially perpendicular to the bottom portion 61. The bottom portion 61 can be secured to the bottom plate 11, so that the rear portion 63 can be received in the opening 15. A positioning hole 631 is defined in the rear portion 63 corresponding to the fastening hole 519, and a punching hole 633 is defined in the rear portion 63 corresponding to the second retaining hole 3532.

The bracket 70 comprises a bracket body 71 and two positioning pieces 72. Each of the positioning pieces 72 can be attached to an inner surface of each side plate 12. A rotating shaft 721 is located on each positioning piece 72, and two rotating holes 711 are defined in opposite sides of the bracket body 71.

Figure 8:
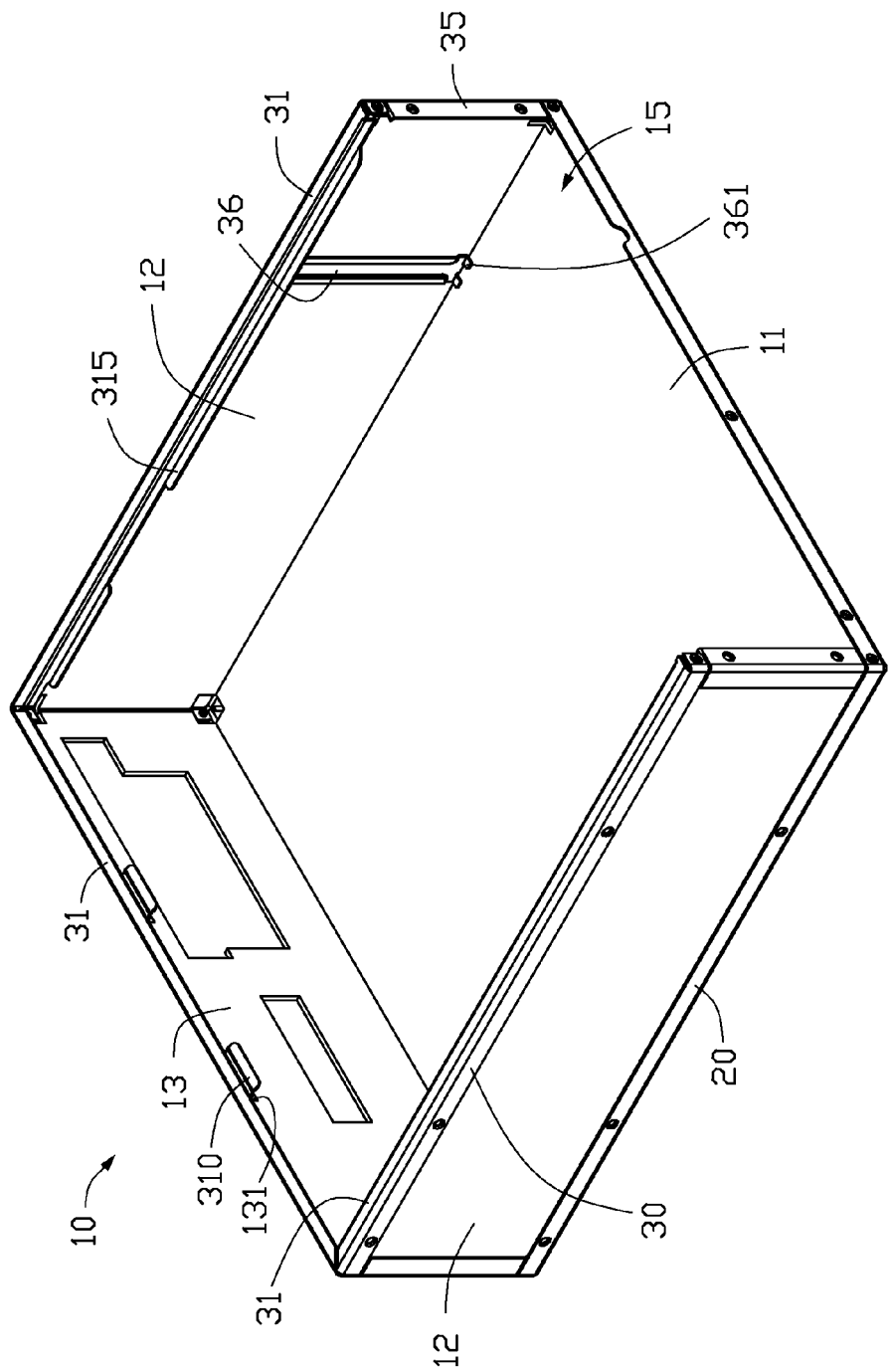
FIG. 8 is an assembled view of the base, the bottom frame, the top frame, four corner brackets and two side brackets of the electronic device enclosure of FIG. 1.

FIG. 8 illustrates when in assembly of the base 10, the bottom frame 20, the top frame 30, four corner brackets 35 and two side brackets 36 of the electronic device enclosure 100 of FIG. 1, the bottom portion 61 is secured to the bottom plate 11 by means, such as screws, clips, or adhesive. The rear portion 63 is received in the opening 15 (see FIG. 7). The four corner brackets 35 are located on the four corners of the base 10, the first retaining panel 351 of each corner bracket 35 is attached a plate of the base 10, and the second retaining panel 353 of each corner bracket 35 is attached to an adjacent plate of the base 10. Each side bracket 36 are located on the bottom plate 11, and the two abutting pieces 361 of one edge of the side bracket 36 abuts the inner surface of the bottom plate 11.

The bottom frame 20 is placed on a bottom portion of the base 10, and the four bottom poles 21 are attached to four edges of the bottom plate 11 respectively. The supporting portion 211 of each bottom poles 21 is supported on the bottom of the base 10. The securing portion 212 of each bottom poles 21 is adhered to the edges of base 10. The plurality of first retaining holes 3531 of the corner brackets 35 are aligned with the plurality of securing holes 213, plurality of blind rivets (not shown) extends through the plurality of securing holes 213 and the first retaining holes 3531 to secure the bottom frame 20 to the corner bracket 35. Therefore, the cover brackets 35 and the bottom frame 20 are secured to the base 10.

The top frame 30 is placed on a top portion of the base 10, one of the three top poles 31 is attached to a top edge of the rear plate 13, and two of the three top poles 31 are attached to a top edge of the two side plates 12 respectively. The two extending pieces 310 are engaged in the two cutouts 131. The pressing portion 311 is pressed on the top portion of the base 10, and the mounting portion 312 is adhered on the edges of the base 10. A plurality of blind rivets (not shown) extends through the plurality of mounting holes 313 to secure the top frame 30 to the top portion of the base 10 At this time, the limiting pieces 315 presses on the other two abutting pieces 361 of the side brackets 36 for preventing the side brackets 36 from moving. Therefore, the two side brackets 36 are secured between the top frame 30 and the bottom plate 11.

Each of the two positioning pieces 72 is adhered to the inner surface of each side plate 12. The rotating shaft 721 is engaged in the rotating hole 711 to secure the bracket body 71 to the base 10.

Figure 9:
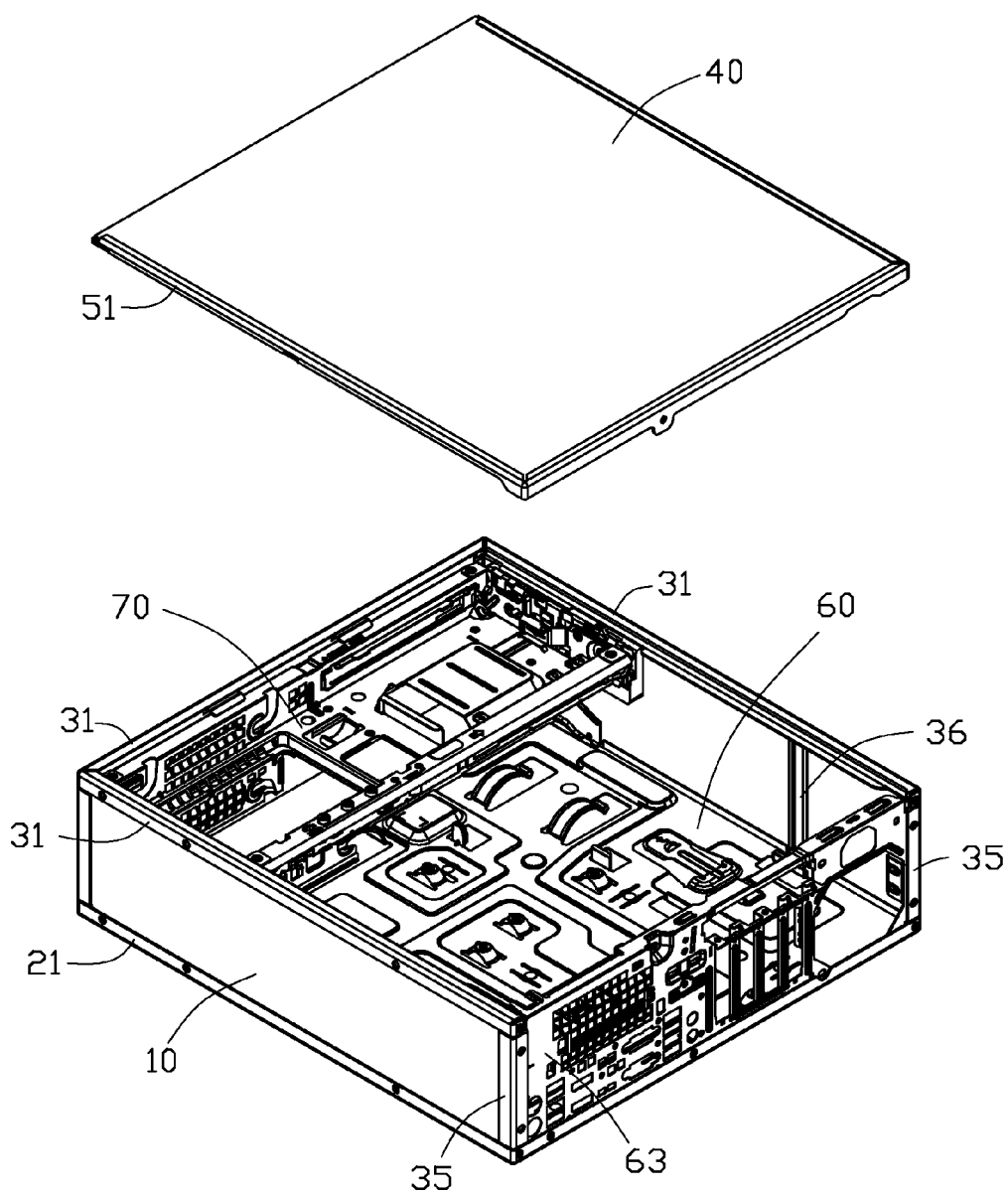
FIG. 9 is an assembled view of the electronic device enclosure of FIG. 1, but a cover is not attached to a base.
Figure 10:
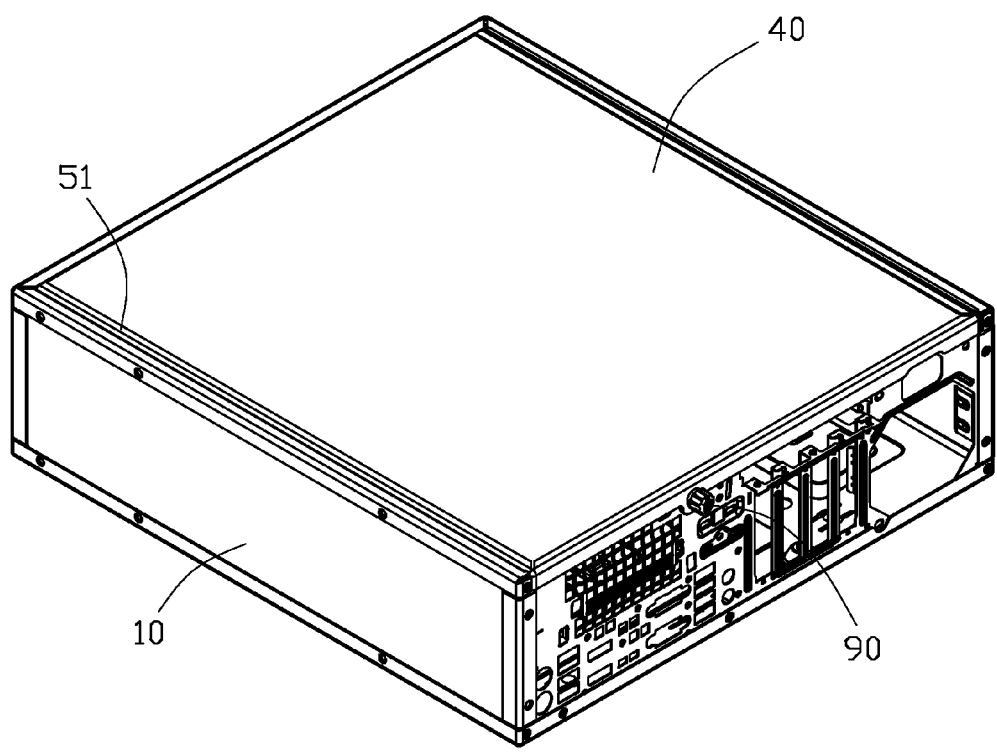
FIG. 10 is an assembled view of the electronic device enclosure of FIG. 1.

FIGS. 9 and 10 illustrate when in assembly of the cover 40 and the cover frame 50, the cover 40 is located in the main body 51, and the supporting piece 515 supports the cover 40. The limiting pieces 516 are resisted on the edges of the cover 40, and the securing poles 52 are adhered to an inner side of the cover 40. The through holes 521 are aligned with the fixing holes 518; a plurality of screws (not shown) is engaged in the through holes 521 and the fixing hole 518 to secure the cover frame 50 to the cover 40.

The cover 40 with the cover frame 50 covers the base 10, and the fastening hole 519 is aligned with the positioning hole 631, and a mounting member 90 is engaged in the fastening hole 519 and the positioning hole 631 to secure the cover 40 to the base 10. The punching hole 633 of the rear portion 63 are aligned with the second retaining hole 3532, a plurality of fixing members (not shown) is engaged in the punching hole 633 and the second retaining hole 3532 to secure the mounting panel 60 to the corner brackets 35. Thus, the electronic device enclosure 100 is assembled.

The base 10 and the cover 40 are made of non-metallic material, such as paper, wood, bamboo, plastic, etc, allowing the electronic device enclosure 100 to be light. The base 10 is strengthened by the bottom frame 20, the top frame 30, the four corner brackets 35 and the side bracket 36, and the cover 40 is strengthened by the cover frame 50.

The embodiments shown and described above are only examples. Many details are often found in the art such as the other features of an electronic device enclosure. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An electronic device enclosure comprising:
a base having:
a bottom plate;
a rear plate with a first edge coupled to an edge of the bottom plate and positioned substantially perpendicular to the bottom plate; and
two opposing side plates, with a first edge of each side plate coupled to an edge of the bottom plate and positioned substantially perpendicular to the bottom plate and a second edge of each side plate coupled to the rear plate and positioned substantially perpendicular to the rear plate;
a cover coupled to the base; and
a top frame for strengthening the base and positioned along a second edge of the rear plate and each side plate, the second rear plate edge being substantially parallel to and opposite the first rear plate edge, and each second side plate edge being substantially parallel to and opposite the first edge of the side plate;
wherein the rear plate defines two cutouts; the top frame comprises three top poles, one of the three top poles comprises two extending pieces engaged in the two cutouts;
wherein, the base and the cover cooperate to form a receiving space for substantially enclosing a plurality of electronic components positioned within the receiving space; and
wherein, the bottom plate, the rear plate and each side plate are each primarily composed of non-metallic material.

2. The electronic device enclosure of claim 1, wherein each top pole comprises a pressing portion and a mounting portion, the pressing portion is pressed on a top portion of the base, the mounting portion is secured to edges of the base.

3. The electronic device enclosure of claim 1, wherein the bottom frame comprises four bottom poles coupled to each other, each bottom pole comprises a supporting portion and a securing portion, the supporting portion supports the base, and the securing portion is secured to the edges of the base.

4. The electronic device enclosure of claim 3, wherein a side bracket is located between the bottom plate and the top frame, the top frame comprises a limiting piece, two abutting pieces extend from each of opposite side of the side bracket, and the abutting pieces of the abut the bottom plate and the limiting piece.

5. The electronic device enclosure of claim 3, wherein four corner brackets are attached to four corners of the base, each corner bracket comprises a first retaining panel and a second retaining panel substantially perpendicular to the first retaining panel, the first retaining panel is attached to the rear plate, and the second retaining panel is attached to the side plate.

6. The electronic device enclosure of claim 5, further comprising a mounting panel, wherein the mounting panel defines a rear portion, the second retaining panel is secured to the bottom frame and the rear portion.

7. The electronic device enclosure of claim 1, wherein the non-metal material is paper.

8. The electronic device enclosure of claim 1, wherein the non-metal material is wood, bamboo, or plastic.

9. The electronic device enclosure of claim 1, wherein a cover frame is attached to the cover and comprises a main body and two securing poles, the main body comprises a connecting pole and two extending poles coupled to the connecting pole, each extending pole is substantially perpendicular to the two securing poles and comprises a supporting piece and a limiting piece, the supporting piece supports the cover, and the limiting piece is resisted on an edge of the cover.

10. An electronic device enclosure comprising:
a base comprising a bottom plate; a rear plate with a first edge coupled to an edge of the bottom plate and positioned substantially perpendicular to the bottom plate; and two opposing side plates, with a first edge of each side plate coupled to an edge of the bottom plate and positioned substantially perpendicular to the bottom plate and a second edge of each side plate coupled to the rear plate and positioned substantially perpendicular to the rear plate;
a base frame located on a bottom portion of the base and comprising four bottom poles attached to four edge of the bottom plate;
four corner bracket attached to four corner of the base, each corner bracket substantially perpendicular to the bottom plate and secured to bottom poles,
a cover attached to the base;
wherein, the base and the cover cooperate to form a receiving space for substantially enclosing a plurality of electronic components positioned within the receiving space;
wherein, the bottom plate, the rear plate and each side plate are each primarily composed of non-metallic material; and
wherein a side bracket is located between the bottom plate and the top frame, the top frame comprises a limiting piece, two abutting pieces extend from each of opposite side of the side bracket, and the two abutting pieces abut the bottom plate and the limiting piece.

11. The electronic device enclosure of claim 10, wherein the cover is made of non-metallic material.

12. The electronic device enclosure of claim 11, wherein the non-metallic material is paper, wood, bamboo, or plastic.

13. The electronic device enclosure of claim 10, wherein each corner bracket comprises a first retaining panel and a second retaining panel substantially perpendicular to the first retaining panel, the first retaining panel is attached to the rear plate, and the second retaining panel is attached to the side plate.

14. The electronic device enclosure of claim 13, further comprising a mounting panel, wherein the mounting panel defines a rear portion, the second retaining panel is secured to the bottom frame and the rear portion.

15. The electronic device enclosure of claim 13, further comprising a top frame, wherein the top frame comprises three top poles, each top pole comprises a pressing portion and a mounting portion, the pressing portion is pressed on a top portion of the base, the mounting portion is secured to edges of the base.

16. The electronic device enclosure of claim 15, wherein a side bracket is located between the bottom plate and the top frame, the top frame comprises a limiting piece, two abutting pieces extend from each of opposite side of the side bracket, and the abutting pieces of the abut the bottom plate and the limiting piece.

17. The electronic device enclosure of claim 10, wherein each bottom pole comprises a supporting portion and a securing portion, the supporting portion supports the base, and the securing portion is secured to the edges of the base.

18. The electronic device enclosure of claim 10, wherein a cover frame is attached to the cover and comprises a main body, the main body comprises a connecting pole and two extending poles coupled to the connecting pole, each extending pole comprises a supporting piece and a limiting piece, the supporting piece supports the cover, and the limiting piece is resisted on an edge of the cover.

* * * * *